United States Patent
Erturk et al.

(10) Patent No.: US 6,917,522 B1
(45) Date of Patent: Jul. 12, 2005

(54) APPARATUS AND METHOD FOR COOLING INTEGRATED CIRCUIT DEVICES

(75) Inventors: Hakan Erturk, Tempe, AZ (US); Ioan Sauciuc, Phoenix, AZ (US); Edgar J. Unrein, Steilacoom, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/747,978

(22) Filed: Dec. 29, 2003

(51) Int. Cl.[7] .............................................. H05K 7/20
(52) U.S. Cl. ...................... 361/700; 361/695; 361/697; 361/699; 257/715; 174/15.2; 165/80.4; 165/104.26; 165/104.33; 62/259.4
(58) Field of Search ................................ 361/689, 690, 361/694–700; 257/714, 715; 174/15.1, 15.2; 165/80.4, 104.26, 104.33; 62/259.2, 259.4

(56) References Cited

U.S. PATENT DOCUMENTS

| | | | | |
|---|---|---|---|---|
| 4,819,011 A | * | 4/1989 | Yokota | ....................... 347/223 |
| 5,737,923 A | * | 4/1998 | Gilley et al. | ................... 62/3.7 |
| 6,003,319 A | * | 12/1999 | Gilley et al. | ................... 62/3.7 |
| 6,233,944 B1 | * | 5/2001 | Yamada et al. | ............... 62/3.7 |
| 2003/0218865 A1 | * | 11/2003 | Macias | ........................ 361/700 |

* cited by examiner

Primary Examiner—Boris Chervinsky
(74) Attorney, Agent, or Firm—Blakely, Sokoloff, Taylor & Zafman LLP

(57) ABSTRACT

Some embodiments of a method and apparatus for cooling integrated circuit devices are described. In one embodiment, the apparatus includes a thermosiphon having an evaporator portion coupled to a first surface of a heat source and a condenser portion coupled to the evaporator portion distal from the first surface of the heat source. A remote heat exchanger is coupled to the condenser of the thermosiphon. In addition, one or more thermoelectric elements are coupled between the heat exchanger and the condenser of the thermosiphon. In one embodiment, the remote heat exchanger, the thermoelectric elements and the condenser portion of the thermosiphon are located outside a chassis of a one rack unit (1U) server computer.

29 Claims, 6 Drawing Sheets

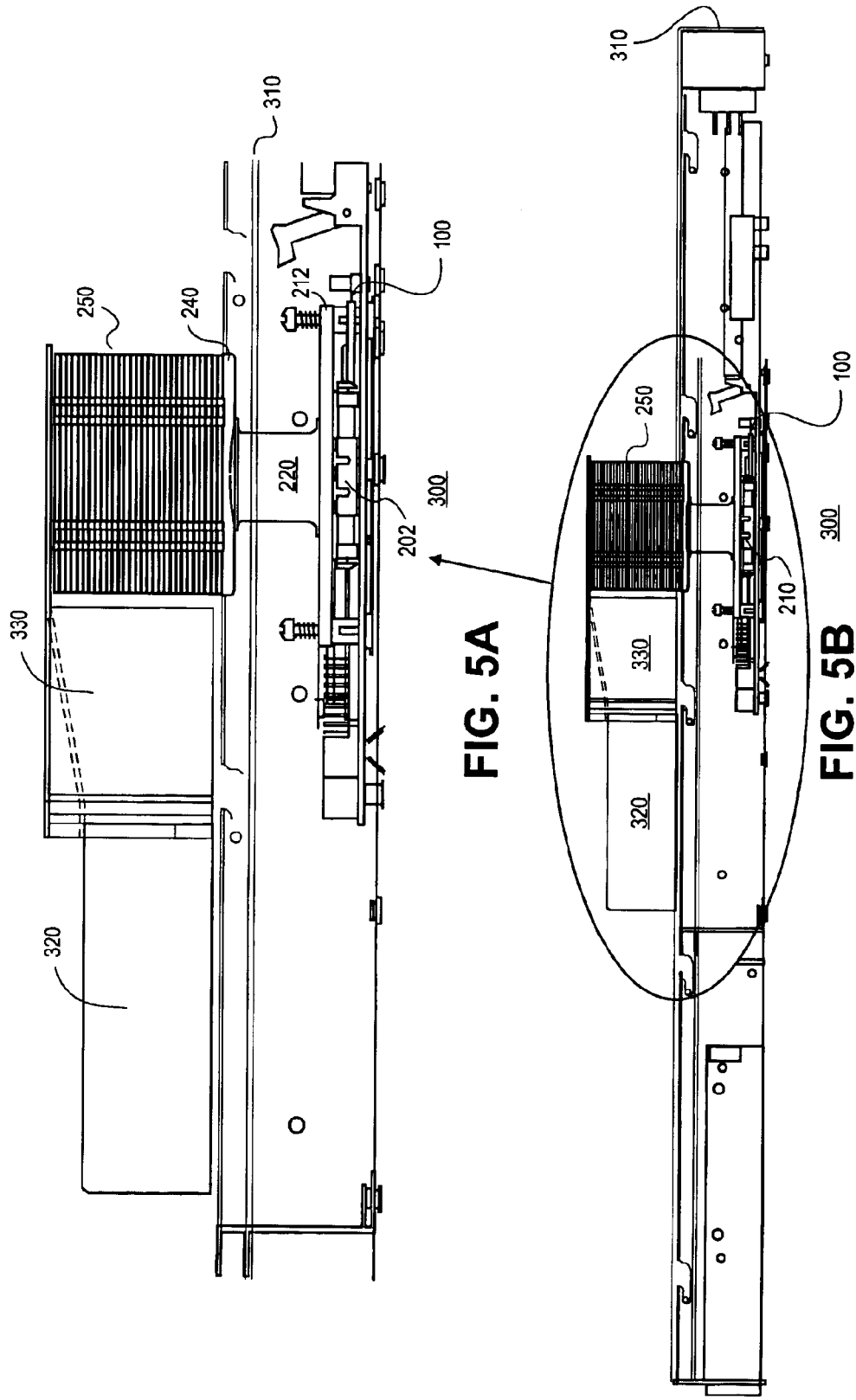

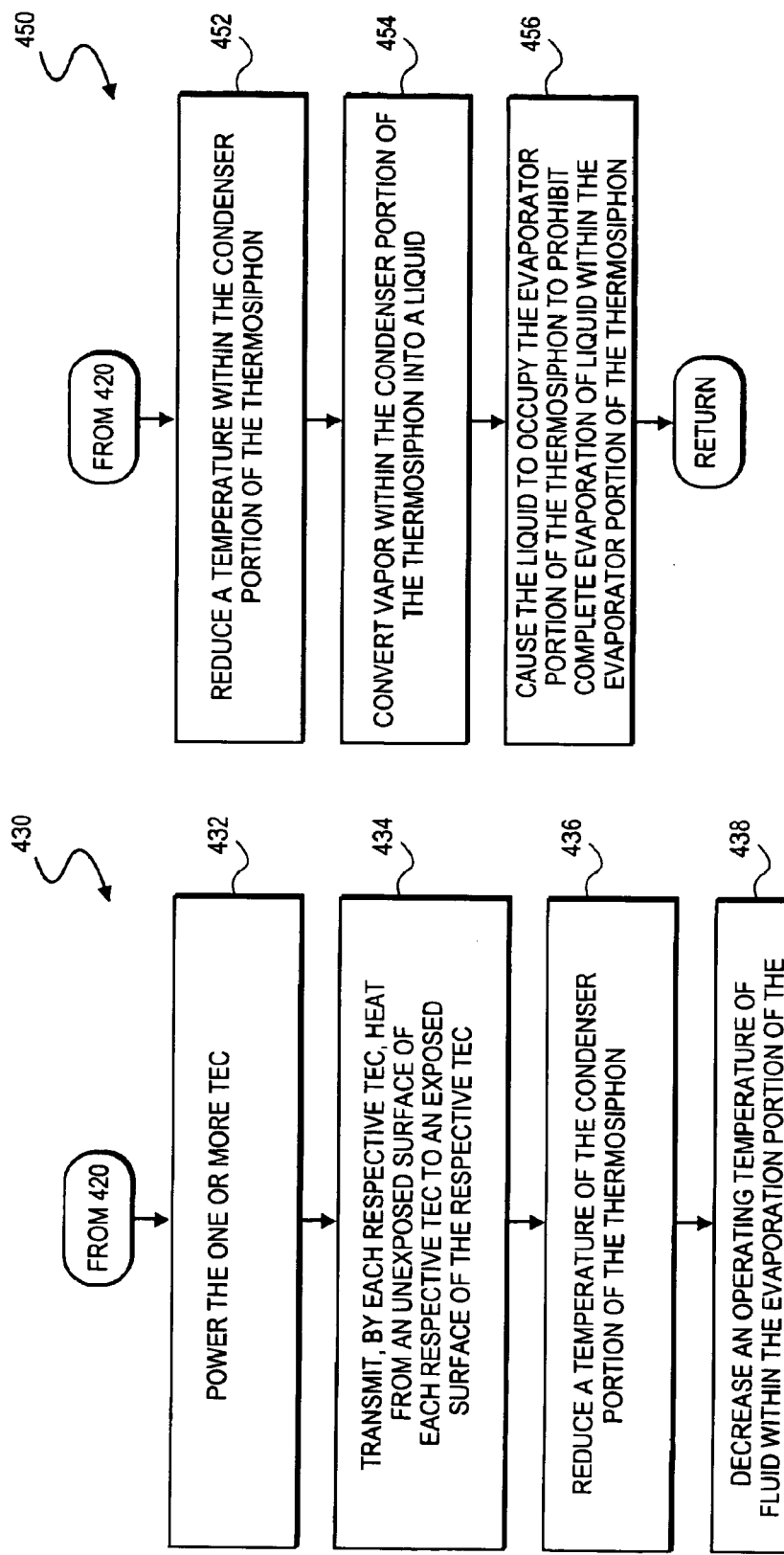

APPARATUS AND METHOD FOR COOLING INTEGRATED CIRCUIT DEVICES

FIELD OF THE INVENTION

One or more embodiments of the invention relate generally to the field of integrated circuit and computer system design. More particularly, one or more of the embodiments of the invention relates to a method and apparatus for cooling integrated circuit devices.

BACKGROUND OF THE INVENTION

The advent of the Internet provides Internet users with a worldwide web of information at the click of a button. As the Internet continues to grow and occupy a ubiquitous position within society, Internet service providers are continuously in competition for providing users with Internet access. Generally, Internet service providers (ISPs) use one or more server computers, which are designed to provide customers of the ISP with Internet access. Unfortunately, as the ISP's customer base grows, the ISP's data center is required to house additional servers in order to provide Internet access to new customers.

Accordingly, central processing unit (CPU) space is at a substantially high premium within an ISP's data center. To combat the war on processor real estate, various companies are shipping slim line, full-featured servers and storage units for the space-constrained ISP. These companies have established a new industry standard for today's Internet servers. According to the new industry standard, the dimension of a server may be limited to 19 inches wide by 1.75 inches high or one rack unit (1U). Hence, compliant servers are commonly referred to as 1U servers.

However, although 1U servers may be compact in size, such servers are required to provide continuously increasing data throughput levels. Hence, technologies, such as data pipelining, out-of-order execution and the like, are required to enable such 1U server architectures to operate at significantly higher clock rates to achieve the data throughput levels. However, the increased clock rates and processing speeds of corresponding IU processors result in substantial heating when incorporated within a 1U server. Consequently, conventional techniques, such as using a solid metal heat sink on top of the processor, while passing air through extended surfaces of the heat sink, are insufficient for dissipating heat produced by modern days 1U processors.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIGS. 5A and 5B illustrate 1U server computer systems, incorporating the cooling system of FIG. 2 and computer system of FIG. 1, in accordance with one embodiment.

FIG. 8 is a flowchart illustrating a method for transferring heat from a surface of a condenser portion of the thermosiphon cooling system, in accordance with one embodiment.

FIG. 9 is a flowchart illustrating a method for transferring heat from a surface of a condenser portion of the thermosiphon, in accordance with one embodiment.

DETAILED DESCRIPTION

A method and apparatus for cooling integrated circuit devices are described. In one embodiment, the apparatus includes a thermosiphon having an evaporator portion coupled to a first surface of a heat source. A condenser portion of the thermosiphon is coupled to the evaporator portion distal from the first surface of the heat source. At least one thermoelectric element is coupled to the condenser portion of the thermosiphon. A remote heat exchanger is coupled to the at least one thermoelectric element.

In one embodiment, the remote heat exchanger, the thermoelectric elements and the condenser portion of the thermosiphon are located outside a chassis of a one rack unit (1U) server computer. Accordingly, by placing the remote heat exchanger, the thermoelectric element and the condenser portion of the thermosiphon outside the 1U server chassis, heat absorbed by the device is cooled by ambient air. In one embodiment, the condenser portion of the thermosiphon is cooled by powering of the thermoelectric element to dissipate heat from the condenser portion and transfer the heat to an exposed surface of the thermoelectric element. Subsequently, a fan or blower is used to blow room temperature air through the heat remote exchanger and the exposed portion of the thermoelectric element.

System

Figure 1:
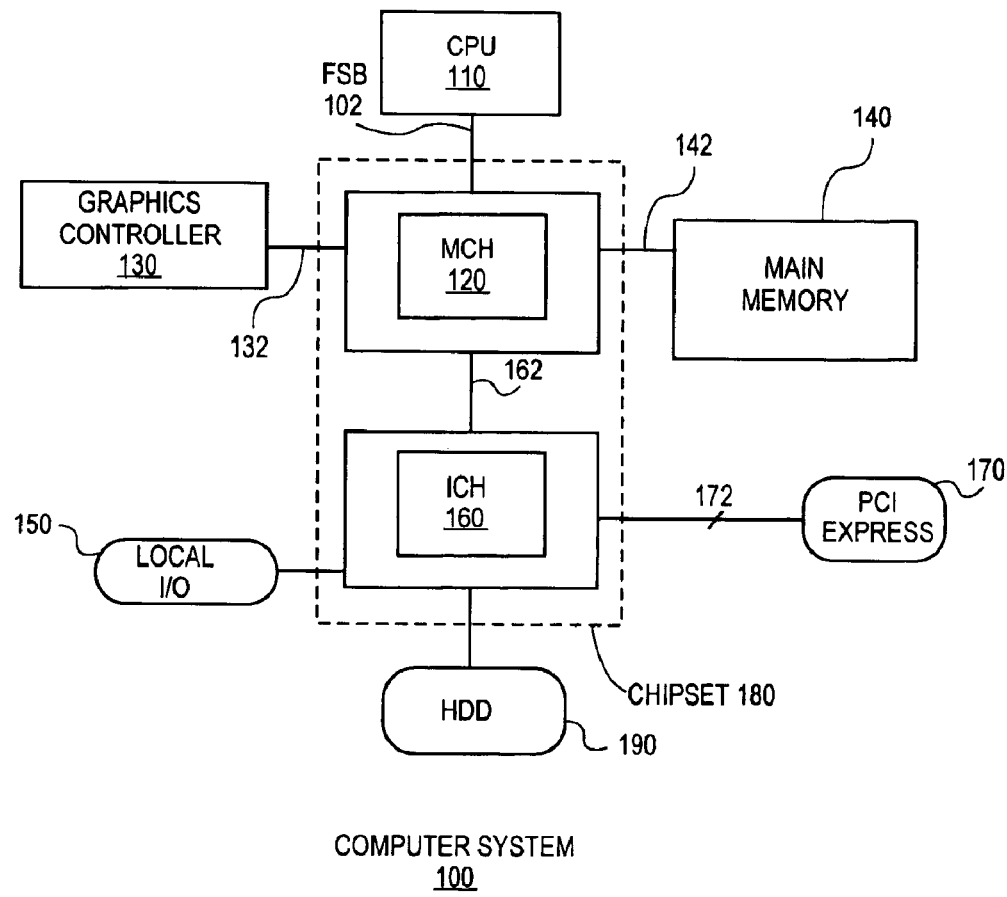
FIG. 1 is a block diagram illustrating a computer system for use within a one rack unit (1U) server computer in accordance with one embodiment.

FIG. 1 is a block diagram illustrating a computer system 100 including a processor 110, in accordance with one embodiment. Computer system 100 comprises a processor system bus (front side bus (FSB)) 102 for communicating information between the processor (CPU) 110 and a chipset 180 coupled together via FSB 102. As described herein, the term "chipset" is used to describe collectively the various devices coupled to CPU 110 to perform desired system functionality.

In one embodiment, chipset 180 includes a memory controller or memory controller hub (MCH) 120, as well as an input/output (I/O) controller or I/O controller hub (ICH) 130. In one embodiment, I/O bus 125 couples MCH 120 to ICH 130. MCH 120 of chipset 180 is coupled to main memory 140 and one or more graphics devices or graphics controller 160. In one embodiment, main memory 110 is volatile memory, including but not limited to, random access memory (RAM), synchronous RAM (SRAM), synchronous dynamic RAM (SDRAM), double data rate (DDR) SDRAM, Rambus dynamic RAM (RDRAM), or the like. In addition, hard disk drive devices (HDD) 150, as well as one or more I/O devices 170 (170-1, ..., 170-N) are coupled to ICH 130.

In one embodiment, computer system 100 may be implemented within a one rack unit (1U) server, a blade server or other like space constrained server. Hence, although computer system 100 may require reconfiguration for placement into a 1U server, in spite of the compact size, computer system 100 is required to provide continuously increasing data throughput levels. Hence, technology, such as data pipeline, out-of-order execution and the like are required to enable computer system 100 to function within a 1U server architecture, while operating at a sufficient clock rate to achieve the data throughput levels.

Unfortunately, increasing the clock rates and processing speeds of processors within 1U servers (1U processors) results in increased, substantial heating when incorporated within a 1U server. Consequently, conventional techniques, such as utilizing a solid metal heat sink on top of the 1U processor and passing air through extended surfaces of the heat sink is insufficient for dissipating heat produced by 1U processors. Accordingly, in one embodiment, thermosiphon cooling system 200, as illustrated in FIG. 2, is used to cool 1U processor 110 of FIG. 1.

Figure 2:
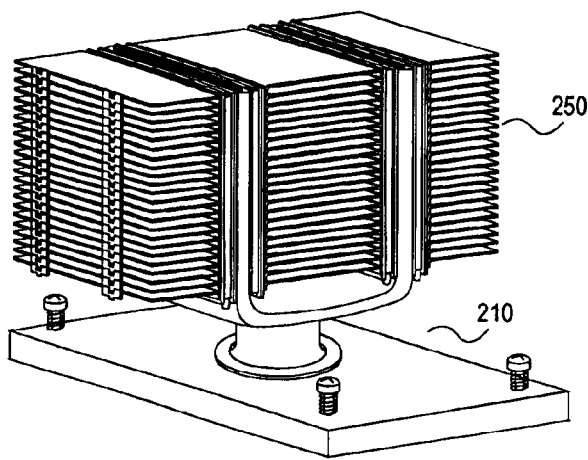
FIG. 2 is a block diagram illustrating a cooling system including a remote heat exchanger in accordance with one embodiment.

As illustrated in FIG. 2, cooling system 200 is configured for attachment to a heat source, such as, for example, CPU 110 of computer system 100 of FIG. 1. Representatively, cooling system 200 comprises thermosiphon 210 and remote heat exchanger 250. In one embodiment, remote heat exchanger 250 is placed outside a 1U server chassis and cooled with blown, room temperature air to assist thermosiphon 210 to dissipate heat from a 1U processor. The various components of thermosiphon cooling system 200 are illustrated with reference to FIG. 3.

Figure 3:
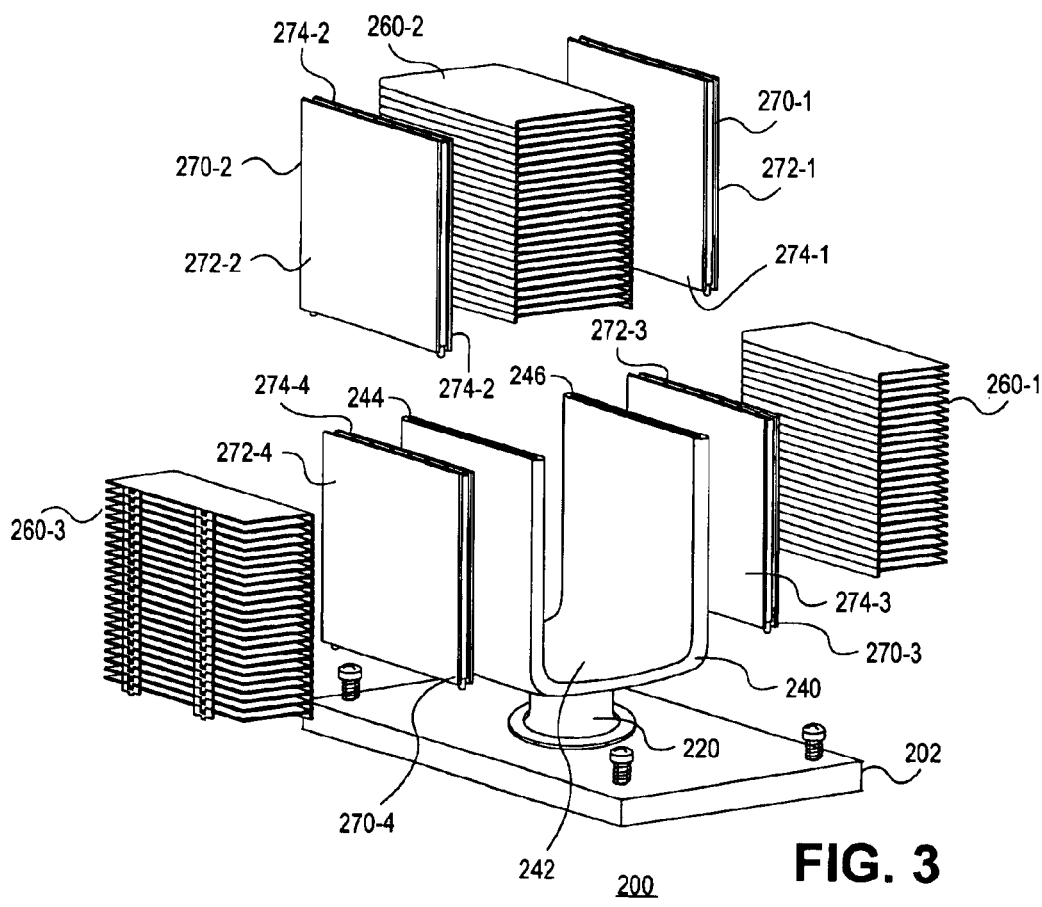
FIG. 3 is a block diagram further illustrating the cooling system of FIG. 1, in accordance with one embodiment.

As illustrated in FIG. 3, cooling system 200 is comprised of an attachment base 202 for coupling to a heat source (not shown). In one embodiment, thermosiphon 210 is a phase-change heatsink comprised of a sealed evaporator portion 220 containing a volatile liquid. Evaporator portion 220 is coupled to a condenser portion 240 of thermosiphon 210. Representatively, condenser portion 240 is illustrated according to an arcuate or U-shaped embodiment. However, as will be recognized by those skilled in the art, various configurations of condenser portion 240 are possible while remaining within the scope of the described embodiments.

In one embodiment, condenser portion 240 includes opposed first condenser arm 244 and second condenser arm 246. Representatively, first condenser arm 244 and second condenser arm 246 are coupled to concave base 242. In one embodiment, first condenser arm 244 and second condenser arm 246, as well as concave base 242 of thermosiphon 210 are hollow to allow vapor or gas to rise from evaporator portion 220. As illustrated in further detail below, thermoelectric elements are coupled to opposed surfaces of first condenser arm 244 and second condenser arm 246 to dissipate heat therefrom.

Figure 4:
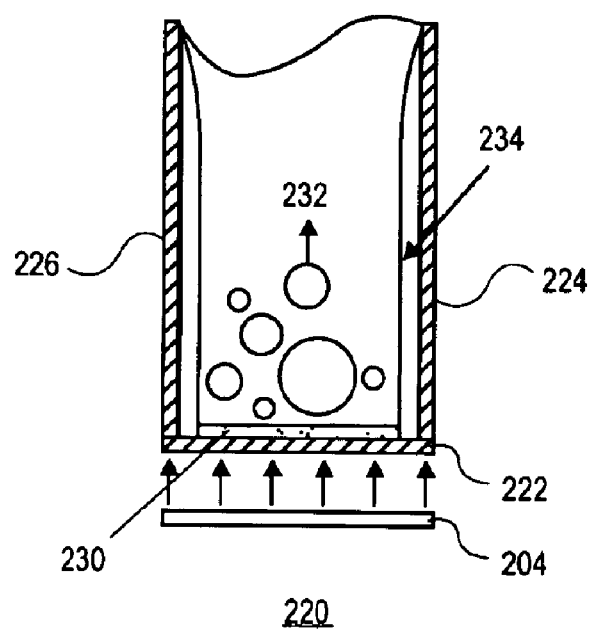
FIG. 4 is a block diagram further illustrating an evaporator portion of the thermosiphon of FIGS. 2 and 3, in accordance with one embodiment.

Referring to FIG. 4, FIG. 4 further illustrates evaporator portion 220 of FIG. 3, in accordance with one embodiment. Representatively, evaporator portion 220 includes a base 222. In one embodiment, base 222 of evaporator portion 220 may include an enhanced boiling structure 230. In one embodiment, the enhanced boiling structure is, for example, a uniform thin film of porous coating, a mesh structure, an extended surface structure or a like material to enhance the ability of evaporator portion 220 to boil a liquid 234 contained within evaporator portion 220.

Representatively, when evaporator portion 220 is placed over heat source 204, liquid 234 within evaporator portion 220 is converted into vapor 232. Vapor 232 then rises from evaporator portion 220 into condenser portion 240 of thermosiphon 210. Hence, in one embodiment, thermosiphon 210 operates as a wickless heatpipe that relies on gravity, rather than the capillary forces of a wick, to return condensate (liquid) 234 to evaporator portion 220. Unfortunately, in normal operation, heat source 204 may eventually deplete liquid within evaporator portion 220 unless the temperature of condenser portion 240 is properly regulated.

In one embodiment, as illustrated in FIG. 3, thermoelectric elements, referred to herein as thermoelectric coolers (TEC) 270 (270-1, 270-2, 270-3, 270-4), are attached to opposed surfaces of first condenser arm 244 and second condenser arm 246. For example, TEC 270-4 includes unexposed surface 274-4 coupled to a surface of first condenser arm 244. As also illustrated, TEC 270-2 is coupled to an opposed surface of first condenser arm 244. TEC 270-1 and TEC 270-3 are coupled to opposed surfaces of second condenser arm 246. Hence, vapor generated from boiling liquid 234 within evaporator portion 220 causes first condenser arm 244 and second condenser arms 246 to heat, which causes the unexposed surfaces (e.g. 272-2, 272-1, 274-4 and 274-3) of the TEC 270 to heat.

In one embodiment, TEC 270 are solid state refrigeration units. In one embodiment, TEC 270 may be powered by an electrical current, which causes the transfer of heat from a first surface (e.g., 272) of TEC 270 to an opposed surface (e.g., 274) of TEC 270. Accordingly, heat from a surface of first condenser arm 244 and second condenser arm 246 is absorbed by unexposed surfaces of TEC 270 and transferred to the exposed surfaces of TEC 270. As a result, the unexposed surfaces of TEC 270 cool condenser portion 240 of thermosiphon 210.

Accordingly, in one embodiment, by providing electrical current to TEC 270, TEC 270 dissipates heat from a surface of the respective condenser arm (244 and 246) and transfers or transmits that heat to an unexposed surface (e.g., 272-4) of TEC 270. As a result, heat within first condenser arm 244 and second condenser arm 246, as well as base 242 of condenser portion 240 is dissipated. In other words, a temperature within condenser portion 240 of thermosiphon 210 is reduced. As a result, vapor 232 within first condenser arm 244 and second condenser arm 246 is caused to return to its liquid form 234 and once again occupy base 222 of evaporator portion 220, as illustrated in FIG. 4.

In a further embodiment, fins 260 (260-1, 260-2, 260-3) are coupled to exposed surfaces of TEC 270. As illustrated in FIG. 3, fins 260-2 are coupled to exposed surface 274-1 of TEC 270-1. Likewise, fins 260-2 are also coupled to exposed surface 274-2 of TEC 270-2. As illustrated in FIG. 2, fins 260-2 are coupled to TEC 270-2 and 270-1 between first condenser arm 244 and second condenser arm 246. As further illustrated in FIG. 3, fins 260-3 are coupled to exposed surface 272-4 of TEC 270-4. Likewise, fins 260-1 are coupled to exposed surface 272-3 of TEC 270-3.

Representatively, fins 260 dissipate heat from exposed surfaces of TEC 270. In one embodiment, air may be blown through fins 260 in order to cool exposed surfaces of TEC 220. As such, the room temperature air assists in dissipating heat from remote heat exchanger 250, resulting in an overall decrease in the temperature of thermosiphon 210. As a result, an operating temperature of fluid 234 within thermosiphon 210 is reduced. However, in contrast to conventional systems, in one embodiment, as illustrated in FIGS. 5A and 5B, remote heat exchanger portion 250 of cooling system 200 is placed outside a computer server chassis.

Accordingly, as illustrated with reference to FIG. 5A, 1U server computer system 300 incorporates cooling system 200, wherein remote heat exchanger portion 250 is placed outside 1U server chassis 310. In the embodiment described, the term "remote heat exchanger" may also collectively refer to first condenser arm 244 and second condenser arm 246, TEC 270 and fins 260. Representatively, remote heat exchanger 250 may be blown with air that is provided via duct 330 from fan/blower 320.

Accordingly, in the embodiment illustrated in FIGS. 5A and 5B, cooling system 200 uses room temperature air to cool exposed surfaces of TEC 270. Representatively, such room or ambient temperature air is not preheated by either server computer components and hence, provides an enhanced ability to dissipate heat transferred from first condenser arm 244 and second condenser arm 246 to exposed surfaces of TECs 270. Conversely, evaporator portion 220 is placed within 1U server 310 and coupled to 1U processor 110 via attachment base 202. Procedural methods for implementing embodiments of the invention are described below.

Operation

Figures 6, 7:
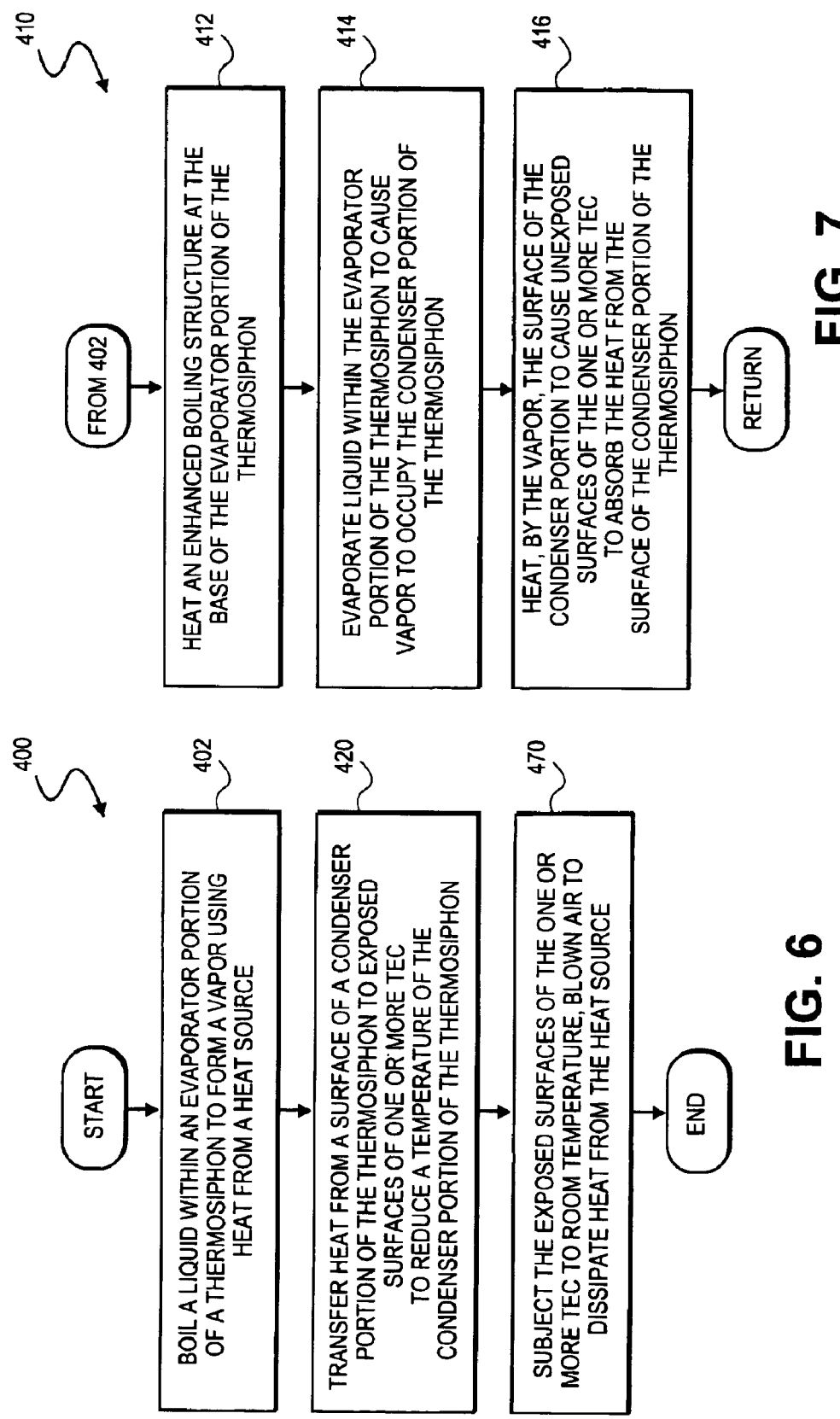
FIG. 6 is a flowchart illustrating a method for cooling a heat source using a cooling system, in accordance with one embodiment.
FIG. 7 is a flowchart illustrating a method for boiling liquid to form vapor using heat from a heat source, in accordance with one embodiment.

FIG. 6 is a flowchart illustrating a method 400 for cooling a heat source using a cooling system, in accordance with one embodiment. Accordingly, in one embodiment, as illustrated with reference to FIGS. 2–5B, the heat source described is a one rack unit (1U) processor. However, as will be recognized by those skilled in the art, the cooling system described herein may be applied to reduce heat within virtually any component of a computer system, including any integrated or on-die circuits.

Representatively, at process block 402, a liquid within an evaporator portion of a thermosiphon is boiled to form a vapor using heat from a heat source. At process block 420, heat from a surface of a condenser portion of the thermosiphon is transferred to exposed surfaces of one or more thermoelectric elements to reduce a temperature of the condenser portion of the thermosiphon. At process block 470, the exposed surfaces of the one or more thermoelectric elements are subject to room temperature, blown air to dissipate heat from the heat source.

FIG. 7 is a flowchart illustrating a method 410 for boiling the liquid within an evaporator portion of the thermosiphon of process block 402 of FIG. 6, in accordance with one embodiment. At process block 412, an enhanced boiling structure at a base of the evaporator portion of a thermosiphon is heated using, for example, heat from a 1U processor. At process block 414, liquid within the evaporator portion of the thermosiphon is evaporated to cause vapor to occupy a condenser portion of the thermosiphon. At process block 416, the surface of the condenser portion is heated by the vapor to cause unexposed surfaces of the one or more thermoelectric elements to absorb the heat from the surface of the condenser portion of the thermosiphon.

FIG. 8 is a flowchart illustrating a method 430 for transferring heat from an unexposed surface to an exposed surface of a thermoelectric element or cooler (TEC). At process block 432, the one or more TECs are powered. At process block 434, each respective TEC transmits heat from an unexposed surface of each respective TEC to an exposed surface of the respective TEC. At process block 436, a temperature of the condenser portion of the thermosiphon is reduced by cooling the condenser portion within an unexposed surface of the TECs. At process block 438, an operating temperature of fluid within the evaporator portion of a thermosiphon is also decreased.

FIG. 9 is a flowchart illustrating a method 450 for transferring heat from the unexposed to the exposed portions of TECs, in accordance with one embodiment. At process block 452, a temperature within the condenser portion of the thermosiphon is reduced. At process block 454, vapor within the condenser portion the thermosiphon is converted into a liquid. At process block 456, liquid occupying the evaporator portion of the thermosiphon is prohibited from completely evaporating. Hence, by using TEC 270, a thermosiphon cooling system, in accordance with embodiments described, continues to perform efficient dissipation of heat from heat source 204, for example, as illustrated with reference to FIG. 4.

Accordingly, by using a cooling system including a thermosiphon with an enhanced boiling structure, the heat from a 1U processor is used to evaporate fluid within the evaporator portion of the thermosiphon. The vapor expands and moves into the condenser part of the thermosiphon where the TECs are attached. By using optimum input power into the TECs, the condenser temperature is lowered by a greater amount than would be achieved without the TECs to cause the vapor to return to liquid form and repeat the cycle. As a result, the operating temperature of the fluid in the thermosiphon is decreased. In turn, the sink temperature of the evaporator portion is decreased, thus prohibiting any ambient resistance.

Alternate Embodiments

It will be appreciated that, for other embodiments, a different system configuration may be used. For example, while the system 300 includes a single 1U CPU 110, for other embodiments, a multiprocessor system (where one or more processors may be similar in configuration and operation to the CPU 110 described above) may benefit from the cooling system of various embodiments. Further different type of system or different type of computer system such as, for example, a server, a workstation, a desktop computer system, a gaming system, an embedded computer system, a blade server, etc., may be cooled using one of the above-described embodiments.

Having disclosed exemplary embodiments and the best mode, modifications and variations may be made to the disclosed embodiments while remaining within the scope of the embodiments of the invention as defined by the following claims.

What is claimed is:

1. An apparatus, comprising:
    a thermosiphon having an evaporator portion coupled to a first surface of a heat source and a condenser portion coupled to the evaporator portion distal from the first surface of the heat source;
    at least one thermoelectric element coupled to the condenser portion of the thermosiphon; and
    a remote heat exchanger coupled to the at least one thermoelectric element.

2. The apparatus of claim 1, wherein the evaporator portion comprises:
    an enhanced boiling structure at a base of the evaporator portion opposite the first surface of the heat source; and
    an attachment base to couple the thermosiphon to the heat source.

3. The apparatus of claim 1, wherein the condenser portion comprises:
    a concave base coupled to the evaporator portion;
    a first condenser arm coupled to a proximal portion of the concave base; and
    a second condenser arm coupled to a distal portion of the concave base opposite the first condenser arm.

4. The apparatus of claim 1, wherein the at least one thermoelectric element further comprises:
    a first pair of thermoelectric elements coupled to opposed surfaces of a first condenser arm of the condenser portion of the thermosiphon; and a second pair of thermoelectric elements coupled to opposed surfaces of a second condenser arm of the thermosiphon.

5. The apparatus of claim 1, wherein the remote heat exchanger comprises:
a plurality of fins coupled to an exposed surface of the at least one thermoelectric element.

6. The apparatus of claim 1, further comprising:
a device to subject the remote heat exchanger and an exposed surface of the at least one thermoelectric element to blown, ambient temperature air.

7. The apparatus of claim 1, wherein the evaporator portion of the thermosiphon is located within a one rack unit (1U) server chassis and wherein the condenser portion of the thermosiphon, the at least one thermoelectric element and the remote heat exchanger are located outside the 1U server chassis.

8. The apparatus of claim 2, wherein the enhanced boiling structure comprises:
a uniform thin film of porous coating formed on the base of the evaporator portion.

9. The apparatus of claim 1, wherein the at least one thermoelectric element is to transfer heat from an unexposed surface of the thermoelectric element, heated by a surface of the condenser portion, toward an exposed surface of the thermoelectric element, facing the heat exchanger, to reduce the temperature of the condenser portion of the thermosiphon.

10. The apparatus of claim 1, wherein the heat source comprises an integrated circuit.

11. A system comprising:
a processor;
a thermosiphon having an evaporator portion coupled to a first surface of a processor and a condenser portion coupled to the evaporator portion distal from a first surface of the processor;
at least one thermoelectric element coupled to the condenser portion of the thermosiphon; and
a remote heat exchanger coupled to the at least one thermoelectric element.

12. The system of claim 11, wherein the evaporator portion comprises:
an enhanced boiling structure at a base of the evaporator opposite the first surface of the heat source.

13. The system of claim 11, wherein the condenser portion comprises:
a concave base coupled to the evaporator portion;
a first condenser arm coupled to a proximal portion of the concave base; and
a second condenser arm coupled to a distal portion of the concave base opposite the first condenser arm.

14. The system of claim 11, wherein the at least one thermoelectric element comprises:
a first pair of thermoelectric elements coupled to opposed surfaces of a first condenser arm of the condenser portion of the thermosiphon; and
a second pair of thermoelectric elements coupled to opposed surfaces of a second condenser arm of the thermosiphon.

15. The system of claim 11, wherein the remote heat exchanger comprises:
a plurality of fins coupled to an exposed surface of the at least one thermoelectric element.

16. The system of claim 11, further comprising:
a device to subject the remote heat exchanger and an exposed surface of the at least one thermoelectric element to blown, ambient temperature air.

17. The system of claim 11, wherein the evaporator portion of the thermosiphon is located within a server chassis and wherein the condenser portion of the thermosiphon, the one or more thermoelectric elements and the remote heat exchanger are located outside the server chassis; and
wherein the server chassis is a one rack unit (1U) server chassis.

18. The system of claim 11, wherein the evaporator portion of the thermosiphon is located within a server chassis and wherein the condenser portion of the thermosiphon, the one or more thermoelectric elements and the remote heat exchanger are located outside the server chassis; and
wherein the server chassis is a blade server chassis.

19. The system of claim 11, wherein the at least one thermoelectric element is to transfer heat from an unexposed surface of the thermoelectric element, a heated by a surface of the condenser portion, toward an exposed surface of the thermoelectric element, facing the heat exchanger, to reduce the temperature of the condenser portion of the thermosiphon.

20. The system of claim 11, further comprising:
a double data rate (DDR), synchronous dynamic random access memory (SDRAM) (DDR SDRAM);
a memory controller coupled between the processor and the DDR SDRAM; and
an input/output controller coupled to the memory controller.

21. The system of claim 11, wherein the processor is a graphics processor.

22. The system of claim 11, wherein the processor is a one rack unit (1U) processor.

23. The system of claim 11, wherein the processor is a blade server processor.

24. The apparatus of claim 12, wherein the enhanced boiling structure comprises:
a uniform thin film of porous coating formed on the base of the evaporator portion.

25. A method comprising:
boiling a liquid within an evaporator portion of a thermosiphon to form a vapor using heat from a heat source;
transferring heat from a surface of a condenser portion of the thermosiphon to exposed surfaces of one or more thermoelectric elements to reduce a temperature of the condenser portion of the thermosiphon; and
subjecting the exposed surfaces of the one or more thermoelectric elements to ambient temperature, blown air to dissipate heat from the heat source.

26. The method of claim 25, wherein boiling comprises:
heating an enhanced boiling structure at the base of the evaporator portion of the thermosiphon;
evaporating liquid within the evaporator portion of the thermosiphon to cause the vapor to occupy the condenser portion of the thermosiphon; and
heating, by the vapor, the surface of the condenser portion to cause unexposed surfaces of the one or more thermoelectric elements to absorb the heat from the surface of the condenser portion of the thermosiphon.

27. The method of claim 25, wherein transferring the heat comprises:
powering the one or more thermoelectric elements;
transmitting, by each respective thermoelectric element, heat from an unexposed surface of each respective thermoelectric element to an exposed surface of the respective thermoelectric element; and reducing a temperature of the condenser portion of the thermosiphon; and decreasing an operating temperature of the fluid within the evaporation portion of the thermosiphon.

28. The method of claim 25, wherein subjecting the exposed surfaces comprises:

operating a fan to blow room temperature air through a heat exchanger coupled to the exposed surfaces of the one or more thermoelectric elements.

29. The method of claim 25, wherein transferring heat comprises:

reducing a temperature within the condenser portion of the thermosiphon;

converting vapor within the condenser portion of the thermosiphon into a liquid; and causing the liquid to occupy the evaporator portion of the thermosiphon to prohibit complete evaporation of liquid within the evaporator portion of the thermosiphon.

* * * * *